(12) United States Patent
Jin et al.

(10) Patent No.: US 9,768,400 B2
(45) Date of Patent: Sep. 19, 2017

(54) METHOD OF MAKING N-TYPE SEMICONDUCTOR LAYER AND METHOD OF MAKING N-TYPE THIN FILM TRANSISTOR

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/735,138

(22) Filed: Jun. 10, 2015

(65) Prior Publication Data
US 2015/0364706 A1    Dec. 17, 2015

(30) Foreign Application Priority Data
Jun. 11, 2014  (CN) .......................... 2014 1 0257169

(51) Int. Cl.
*H01L 51/05*    (2006.01)
*H01L 51/00*    (2006.01)

(52) U.S. Cl.
CPC ........ *H01L 51/0525* (2013.01); *H01L 51/002* (2013.01); *H01L 51/0048* (2013.01); *H01L 51/0541* (2013.01); *H01L 51/0545* (2013.01)

(58) Field of Classification Search
CPC ............. H01L 51/0048; H01L 51/0525; H01L 51/0541; H01L 51/0545
See application file for complete search history.

(56) References Cited

U.S. PATENT DOCUMENTS

| | | | |
|---|---|---|---|
| 2005/0271812 A1* | 12/2005 | Myo .................. | C23C 16/0272 427/248.1 |
| 2011/0101302 A1* | 5/2011 | Zhou ..................... | B82Y 10/00 257/13 |
| 2014/0124737 A1* | 5/2014 | Takei .................. | H01L 51/0558 257/29 |

OTHER PUBLICATIONS

Zhang et al., "Air-Stable Conversion of Separated Carbon Nanotube Thin-Film Transistor from p-type to n-type Using Atomic Layer Deposition of High-k Oxide and Its Application in CMOS Logic Circuits", ACS Nano, vol. 5, pp. 3284-3292 (2011).*

(Continued)

*Primary Examiner* — Bilkis Jahan
*Assistant Examiner* — Victor Barzykin
(74) *Attorney, Agent, or Firm* — Steven Reiss

(57) ABSTRACT

A method of making N-type semiconductor layer includes following steps. A semiconductor carbon nanotube layer is provided. A hafnium oxide layer is deposited on the semiconductor carbon nanotube layer via atomic layer deposition, wherein the atomic layer deposition includes following substeps. The semiconductor carbon nanotube layer is located into an atomic layer deposition system. The semiconductor carbon nanotube layer is heated to a temperature ranging from about 140° C. to about 200° C. A protective gas is continuously introduced into the atomic layer deposition system. The hafnium oxide layer is formed on the semiconductor carbon nanotube layer via introducing hafnium source and water vapor one by one into the atomic layer deposition system in a pulse manner.

18 Claims, 10 Drawing Sheets

(56) References Cited

OTHER PUBLICATIONS

Liu et al., "ALD of Hafnium Oxide Thin Films from Tetrakis(ethylmethylamino)hafnium and Ozone", Journal of The Electrochemical Society, 152 (3), G213-G219 (2005).*

Hausmann et al., "Atomic Layer Deposition of Hafnium and Zirconium Oxides Using Metal Amide Precursors", Chem Mater. 14, pp. 4350-4358 (2002).*

Aarik et al., "Influence of carrier gas pressure and flow rate on atomic layer deposition of HfO2 and ZrO2 thin films", Applied surface science, 252, pp. 5723-5734 (2006).*

Shuo Li, "Optimization of precursor pulsing in atomic layer deposition", Master's Thesis, Helsinki University of Technology.*

* cited by examiner

Form an N-type semiconductor layer on a surface of the insulating substrate, wherein the N-type semiconductor layer comprises a semiconductor carbon nanotube layer and a hafnium oxide layer stacked on the insulating substrate

Apply a source electrode and a drain electrode on the N-type semiconductor layer, wherein the source electrode and the drain electrode are spaced from each other and electrically connected to the semiconductor carbon nanotube layer

Form a gate electrode on the N-type semiconductor layer, wherein the gate electrode is insulated from the semiconductor carbon nanotube layer

FIG. 8

METHOD OF MAKING N-TYPE SEMICONDUCTOR LAYER AND METHOD OF MAKING N-TYPE THIN FILM TRANSISTOR

This application claims all benefits accruing under 35 U.S.C. §119 from China Patent Application No. 201410257169.5, filed on Jun. 11, 2014 in the China Intellectual Property Office, the contents of which are hereby incorporated by reference.

BACKGROUND

1. Technical Field

The present invention relates to a method of making N-type semiconductor layer and a method of making N-type thin film transistors with the N-type semiconductor layer.

2. Description of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconductor layer from an accumulation state to a depletion state, with applied voltage to the gate electrode, to change an amount of the current passing between the drain electrode and the source electrode.

The N-type semiconductor layer is usually manufactured via doped method or depositing oxide layer at high temperature higher than 250° C. However, the method of making doped N-type semiconductor layer is complex, and the doped N-type semiconductor layer is limited in stability. Furthermore, the flexible substrate cannot sustain high temperature, and the deposition method cannot be compatible with the semiconductor process. Thus the N-type semiconductor layer is hard to form on the flexible substrate.

What is needed, therefore, is a method of making N-type semiconductor layer and a method of making N-type TFT that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 8 shows a flow chart of another embodiment of a method of making N-type TFT.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
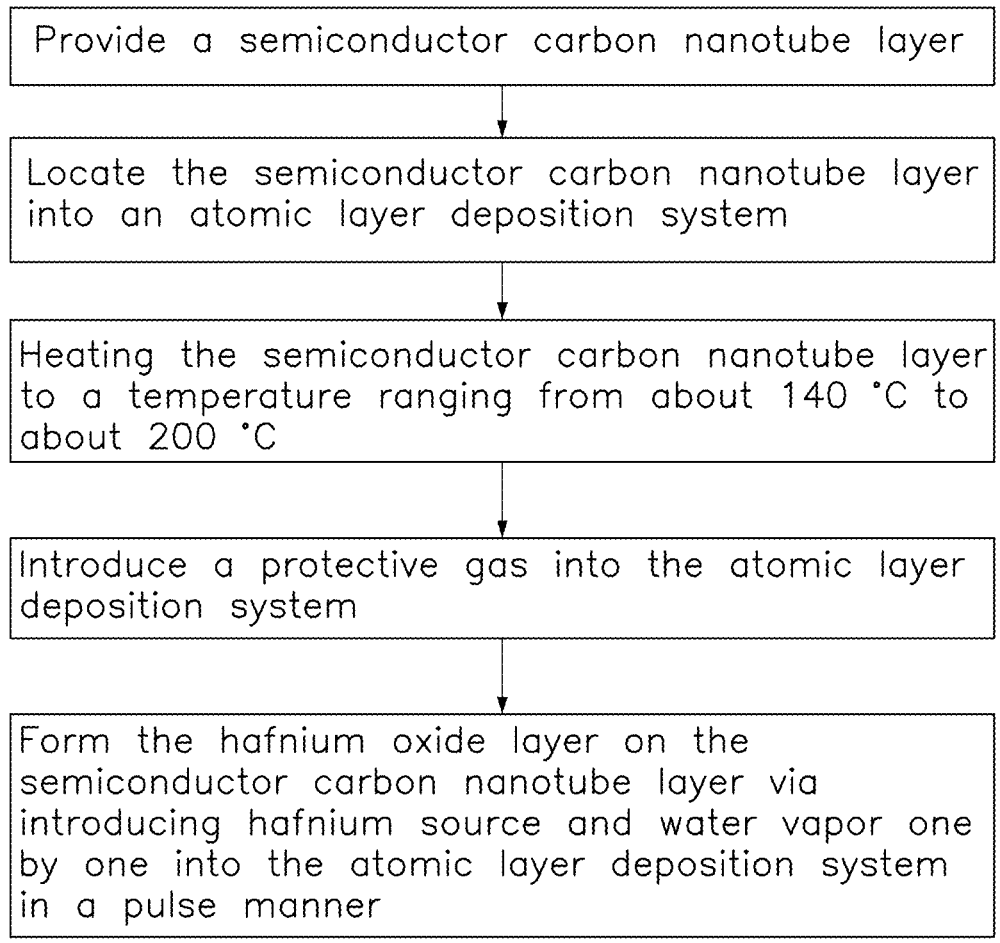
FIG. 1 is a flow chart of one embodiment of a method of making N-type semiconductor layer.
Figure 2:
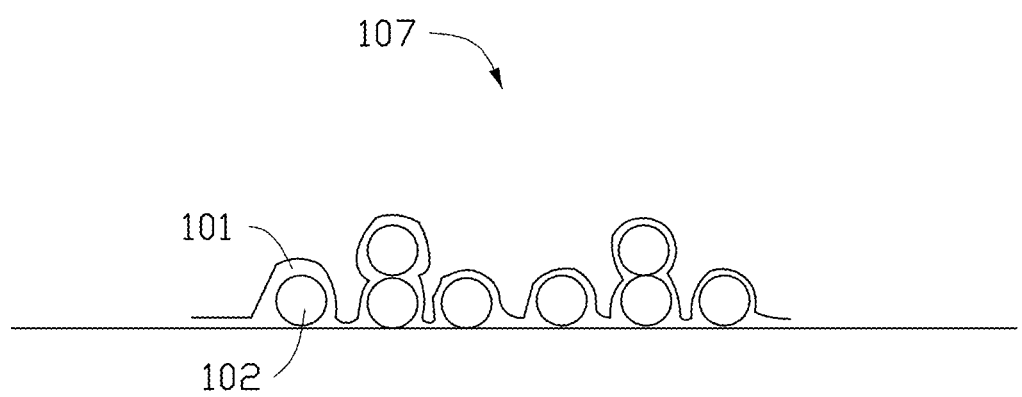
FIG. 2 is a cross sectional view of the N-type semiconductor layer.

Referring to FIG. 1 and FIG. 2, one embodiment of a method of making an N-type semiconductor layer 107 comprises:

step (S11), providing a semiconductor carbon nanotube layer 102; and step (S12), depositing a hafnium oxide layer 101 on the semiconductor carbon nanotube layer 102 via atomic layer deposition (ALD).

In step (S11), the semiconductor carbon nanotube layer 102 comprises a plurality of carbon nanotubes. The plurality of carbon nanotubes are connected with each other to form a conductive network. The carbon nanotube layer can consist of a plurality of semi-conductive carbon nanotubes.

The carbon nanotubes of the carbon nanotube layer 102 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer are arranged to extend along the direction substantially parallel to the surface of the carbon nanotube layer. In one embodiment, all the carbon nanotubes in the carbon nanotube layer are arranged to extend along the same direction. In another embodiment, some of the carbon nanotubes in the carbon nanotube layer are arranged to extend along a first direction, and some of the carbon nanotubes in the carbon nanotube layer are arranged to extend along a second direction, perpendicular to the first direction.

In one embodiment, the carbon nanotube layer is a free-standing structure and can be drawn from a carbon nanotube array. The term "free-standing structure" means that the carbon nanotube layer can sustain the weight of itself when it is hoisted by a portion thereof without any significant damage to its structural integrity. Thus, the carbon nanotube layer can be suspended by two spaced supports. The free-standing carbon nanotube layer can be laid on the insulating layer 104 directly and easily.

The carbon nanotube layer can be a substantially pure structure of the carbon nanotubes, with few impurities and chemical functional groups. The carbon nanotube layer can also be composed of a combination of semi-conductive and metallic carbon nanotubes obtained via chemical vapor deposition. The ratio of semi-conductive and metallic of carbon nanotubes is 2:1. Furthermore, the ratio of the semiconductor carbon nanotubes in the semiconductor carbon nanotube layer 102 ranges from about 90% to about 99%. In one embodiment, the metallic carbon nanotubes in the semiconductor layer 102 are removed. The semiconductor carbon nanotube layer 102 has good semi-conductive property. In one embodiment, the semiconductor carbon nanotube layer 102 consists of a plurality of single-walled carbon nanotubes. The plurality of single-walled carbon nanotubes are parallel with each other. A diameter of the carbon nanotube is smaller than 2 nanometers. A thickness of the semiconductor carbon nanotube layer 102 ranges from about 0.5 nanometers to about 2 nanometers. In one embodiment, the diameter of the carbon nanotube is smaller than 1 nanometer.

Figure 3:
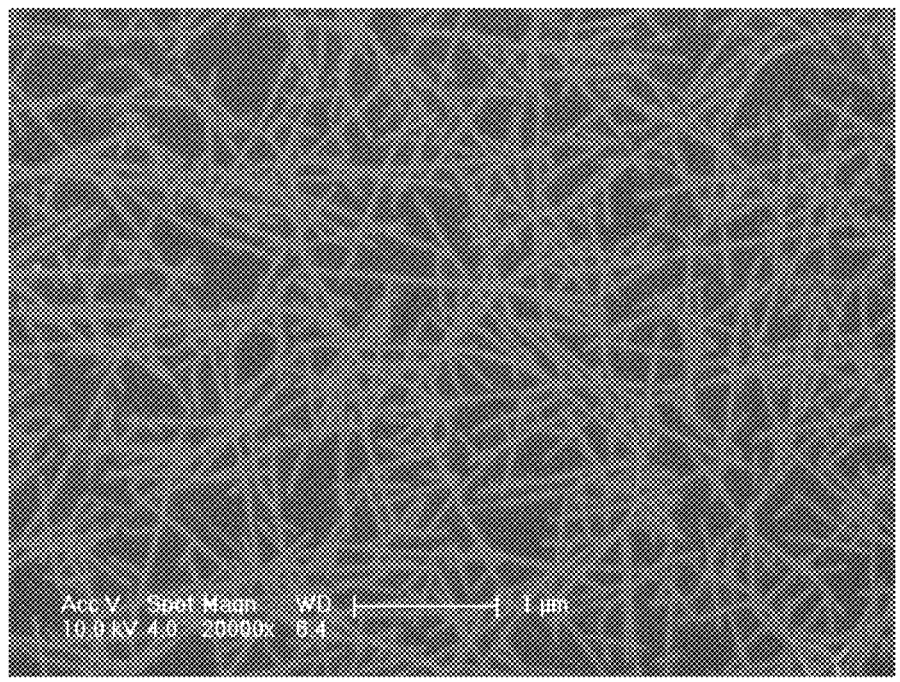
FIG. 3 is a scanning electron microscope (SEM) view of a semiconductor carbon nanotube film.

Referring to FIG. 3, in another embodiment, the semiconductor carbon nanotube layer 102 consists of the single-walled carbon nanotubes, and a percentage of the semiconductor carbon nanotubes in the semiconductor carbon nanotube layer 102 is about 95%. The plurality of single-walled carbon nanotubes are entangled with each other to form the conductive network. The thickness of the semiconductor carbon nanotube layer 102 is about 1 nanometer.

In step (S12), the hafnium oxide layer 101 can be deposited by:

step (S121), locating the semiconductor carbon nanotube layer 102 into an ALD system and adjusting temperature and pressure in the reactor;

step (S122), introducing a protective gas;

step (S123), forming the hafnium oxide layer 101 on the semiconductor carbon nanotube layer 102 via introducing hafnium source and water vapor carried by an carrier gas in a pulse manner.

In step (S121), the ALD system 200 comprises a gas inlet pipe 201, a reactor chamber 202, a work platform 203, and a gas outlet pipe 204. The work platform 203 is located in the reactor chamber 202. The semiconductor carbon nanotube film 102 is located on the work platform 203. The temperature and the pressure in the ALD system 200 can be adjusted. In one embodiment, the temperature in the gas inlet pipe 201 can range from about 70° C. to about 75° C. Thus the gas can be introduced into the reactor chamber 202 in gaseous state. The gases cannot react with each other in the gas inlet pipe 201. The temperature of the reactor chamber 202 can range from about 90° C. to about 100° C. The temperature of the work platform 203 can range from about 140° C. to about 200° C. The temperature of the work platform 203 can range from about 140° C. to about 150° C. Thus the work platform 203 can be used to manufacture semiconductor device on flexible substrate. Furthermore, the work platform 203 can be compatible with the semiconductor process, and the energy consumption can be reduced. In contrast, while the temperature of the reactor chamber is lower than 140° C., the oxygen attached on the semiconductor carbon nanotube layer 102 cannot be detached from the semiconductor carbon nanotube layer 102, and the property of the N-type semiconductor layer will be affected. The temperature of the gas outlet pipe ranges from about 120° C. to about 130° C., thus the gas can be fluently excluded. The pressure in the reactor chamber 202 can range from about 0.14 Torr to about 0.15 Torr. In one embodiment, the temperature of the gas inlet pipe 201 is about 75° C., the temperature of the reactor chamber 202 is about 100° C., the temperature of the work platform 203 is about 150° C., the temperature of the gas outlet pipe 201 is about 130° C., and the pressure in the reactor chamber 202 is about 0.15 Torr.

In step (S122), the protective gas is used to exclude the air or other excess reactive gases. The protective gas is continuously introduced into the reactive chamber. The protective gas can be nitrogen or argon. In one embodiment, the protective gas is nitrogen.

In step (S123), the hafnium source and water vapor can be introduced into the reactor chamber in the pulse manner. The carrier gas can be nitrogen or argon. The hafnium source can be tetrakis (dimethylamino) hafnium ($C_8H_{24}HfN_4$) or nitrate hafnium ($Hf(NO_3)_4$). The hafnium source is heated into about 70° C. to about 75° C. before being introduced into the reactor chamber, and the evaporation of the hafnium source can be increased. The water vapor can be obtained by naturally evaporating water in room temperature, and the room temperature can ranges from about 18° C. to about 35° C. The flow rate of the carrier gas containing hafnium source can range from about 20 sccm to about 40 sccm, and the pulse time ranges from about 0.02 s to about 0.03 s. The flow rate of the carrier gas containing water vapor can range from about 3 sccm to about 5 sccm, and the pulse time can range from about 0.01 s to 0.015 s.

The hafnium source will be introduced for a first pulse, and then closed. After a first interval T1, the water vapor is introduced into the reactor chamber for a second pulse and then closed. After a second interval T2, the hafnium source will be introduced into the reactor chamber again. Thus one cycle is finished. The first interval T1 can range from about 55 seconds to about 65 seconds, and the second interval T2 can range from about 55 seconds to about 60 seconds. The continuous hafnium oxide layer 101 can be formed on the semiconductor carbon nanotube layer 102 through a plurality of cycles.

A thickness of the hafnium oxide layer 101 can range from about 5 nanometers to about 40 nanometers. In one embodiment, the thickness of the hafnium oxide layer 101 ranges from about 20 nanometers to about 30 nanometers. A growth rate of the hafnium oxide layer 101 ranges from about 1.04 Å/cycle to about 1.18 Å/cycle.

The hafnium oxide layer 101 continuously covers the plurality of carbon nanotubes in the semiconductor carbon nanotube layer 102, and the plurality of carbon nanotubes will be isolated from the oxygen in the air. Furthermore, the plurality of carbon nanotubes will be doped with electrons, and the plurality of carbon nanotubes covered with hafnium oxide will embody N-type characteristic. In addition, by increasing the hafnium source, the quantity of the hafnium oxide layer 101 will be increased, and the compactness of the hafnium oxide layer 101 will be increased. Thus the N-type characteristic can be improved.

In one embodiment, the flow rate of the hafnium source can be about 30 sccm, and the first pulse is about 0.03 seconds. The flow rate of the water vapor is about 5 sccm, and the second pulse is about 0.015 seconds. The first interval T1 is about 60 seconds, and the second interval T2 is about 60 seconds. The thickness of the hafnium oxide layer 101 is about 30 nanometers, and the growth rate is about 1.18 Å/cycle.

Figure 4:
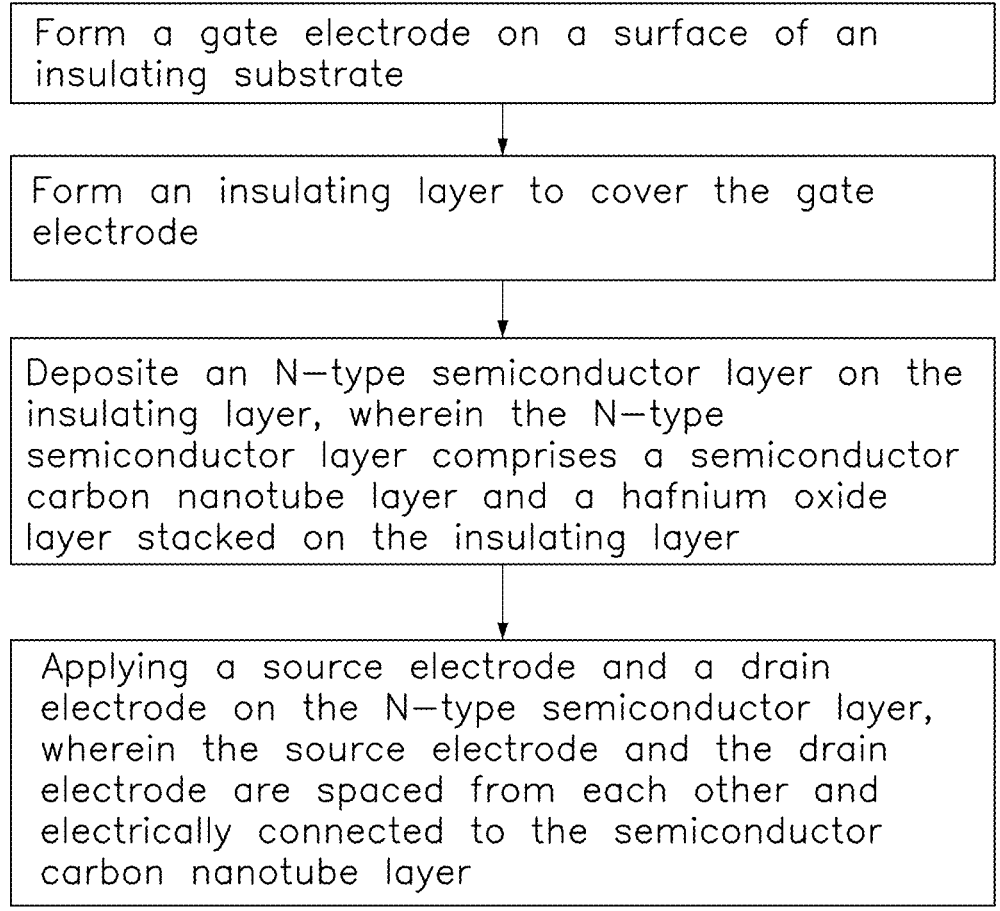
FIG. 4 shows a flow chart of one embodiment of a method of making N-type TFT.
Figure 5:
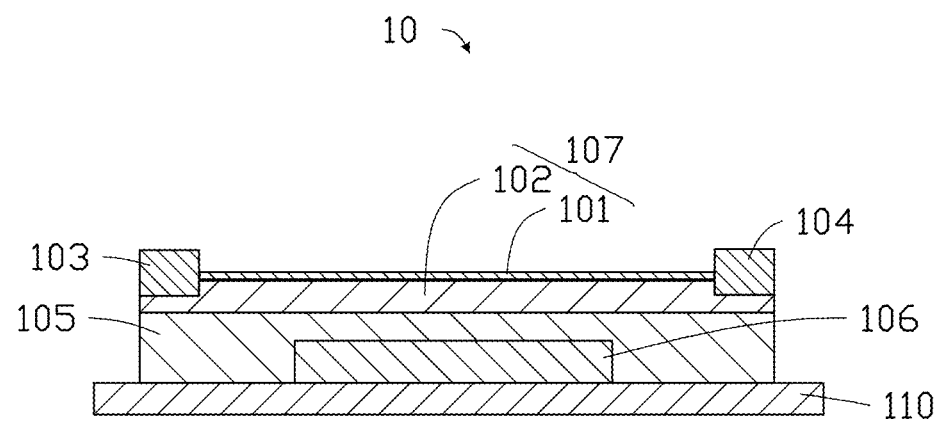
FIG. 5 shows a cross sectional view of the N-type TFT.

Referring to FIGS. 4-5, one embodiment of a method of making N-type TFT 10 comprises:

step (S21), forming a gate electrode 106 on a surface of an insulating substrate 110;

step (S22), forming an insulating layer 105 to cover the gate electrode 106;

step (S23), depositing an N-type semiconductor layer 107 on the insulating layer 105, wherein the N-type semiconductor layer 107 comprises a semiconductor carbon nanotube layer 102 and a hafnium oxide layer 101 stacked on the insulating layer 105; and step (S24), applying a source electrode 103 and a drain electrode 104 on the N-type semiconductor layer 107, wherein the source electrode 103 and the drain electrode 104 are spaced from each other and electrically connected to the semiconductor carbon nanotube layer 102.

In step (S21), the insulating substrate 110 is provided for supporting the thin film transistors 10. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin).

The material of the insulating substrate 110 can be polyethylene terephthalate, polyethylene naphthalate, or polyimide. In one embodiment, the material of the insulating substrate 110 is polyethylene terephthalate.

The gate electrode 106 can be formed via evaporating, sputtering, or printing. In one embodiment, the gate electrode 106 is formed on the insulating substrate 110 via evaporating a composite layer comprising Au and Ti.

In step (S22), the insulating layer 105 can be formed via evaporating, sputtering, or atom layer depositing. In one embodiment, the insulating layer 105 is formed on the gate electrode 106 away from the insulating substrate 110 via atom layer deposition, material of the insulating layer 105 is aluminum oxide, and a thickness of the insulating layer 105 is about 40 nanometers.

The material of the insulating layer 105 can also be selected from hard material such as aluminum oxide, hafnium oxide, or silicon nitride; or other flexible material such as benzocyclobutene (BCB), polyester, or acrylic resin. The thickness of the insulating layer 105 can range from about 0.5 nanometers to about 100 micrometers In step (S23), the N-type semiconductor layer 107 can be formed on the insulating substrate 110 in the ALD system as describe above. The hafnium oxide layer 101 can be formed on the surface of the carbon nanotube layer 102 away from the insulating layer 105. The thickness of the hafnium oxide layer 101 can be selected according to the function of the hafnium oxide layer 101 in the TFT 10. In one embodiment, the TFT 10 is a bottom-gate type device, thus the function of the hafnium oxide layer 101 is to isolate the oxygen in the air and introduce electrons in to the semiconductor layer 107. Therefore the thickness of the hafnium oxide layer 101 can be greater than 5 nanometers. In another embodiment, the TFT 10 is top-gate type device, the hafnium oxide layer 101 is also functioned as insulating layer, and the thickness of the hafnium oxide layer 101 is greater than 10 nanometers.

In step (S24), the source electrode 103 and the drain electrode 104 are electrically connected to the semiconductor carbon nanotube layer 102. Furthermore, the excess hafnium oxide layer 101 on the positions of source electrode 103 and the drain electrode 104 should be removed.

The method of forming the source electrode 103 and the drain electrode 104 can be same as the method of forming gate electrode 106. The material of the source electrode 103 and the drain electrode 104 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the source electrode 103 and the drain electrode 104 can comprises Au and Ti. The thickness of the Ti is about 2 nanometers, and the thickness of the Au is about 50 nanometers.

The method of making N-type TFT has following advantages. The hafnium oxide layer can be formed on the semiconductor carbon nanotubes at lower temperature, thus the TFT can be directly formed on the flexible substrate. Furthermore, the method can be compatible with the semiconductor process such as lithography process. The method of making N-type TFT can successfully transfer the P-type CNT device into N-type CNT TFT, and then the CMOS can be easily achieved by combining the P-type CNT device and N-type CNT device. Therefore, the integration can be improved, the performance can be enhanced, and the loss can be reduced.

The N-type TFT 10 is the bottom-gate electrode type or back-gate electrode type TFT. In use, the source electrode is grounded. A voltage Vds is applied to the drain electrode. Another voltage Vg is applied on the gate electrode. The voltage Vg forming an electric field in the channel of the semiconducting layer. Accordingly, carriers exist in the channel near the gate electrode. As the Vg increasing, a current is generated and flows through the channel. Thus, the source electrode and the drain electrode are electrically connected.

Figure 6:
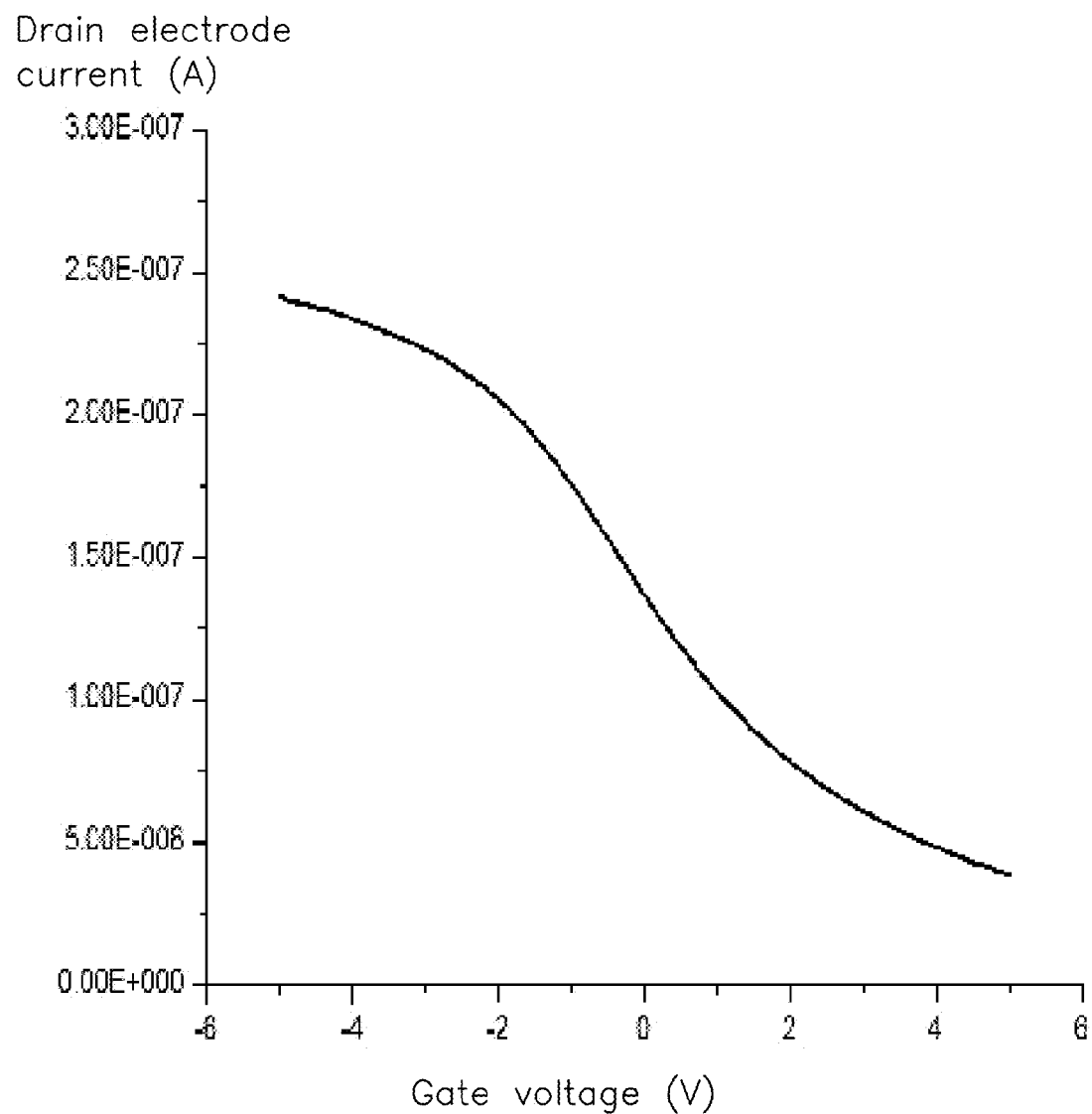
FIG. 6 shows a schematic view of I-V graph of a P-type TFT.

Referring to FIG. 6, an I-V graph of a TFT without hafnium oxide on the semiconductor carbon nanotube layer is provided. The semiconductor carbon nanotube layer is P-type. While the voltage Vd is applied on the drain electrode, and the negative voltage Vg is applied on the gate electrode, the TFT cannot work. Then the TFT is a P-type TFT.

Figure 7:
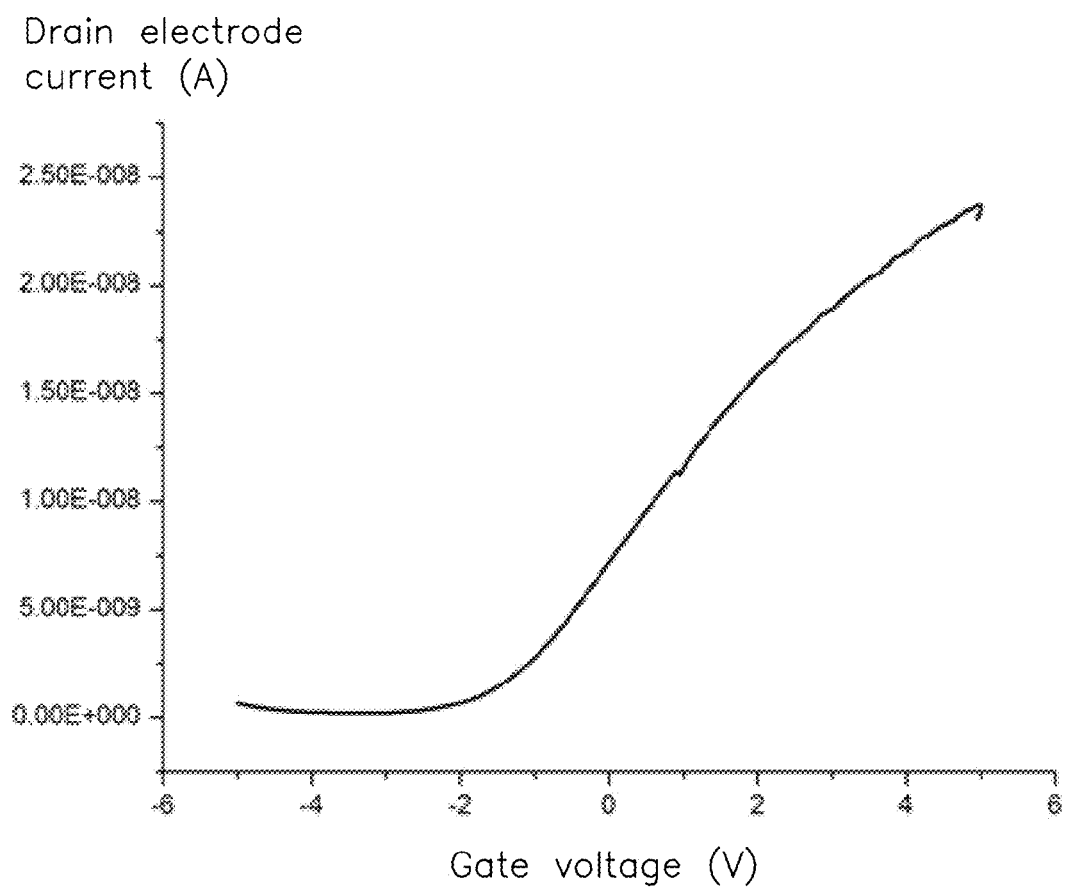
FIG. 7 shows a schematic view of I-V graph of the N-type TFT.

Referring to FIG. 7, while the hafnium oxide is deposited on the semiconductor carbon nanotube layer as shown in TFT 10, the voltage Vd is applied on the drain electrode, and the positive voltage Vg is applied on the gate electrode, the TFT 10 will work. Thus the TFT 10 is the N-type TFT.

Figure 9:
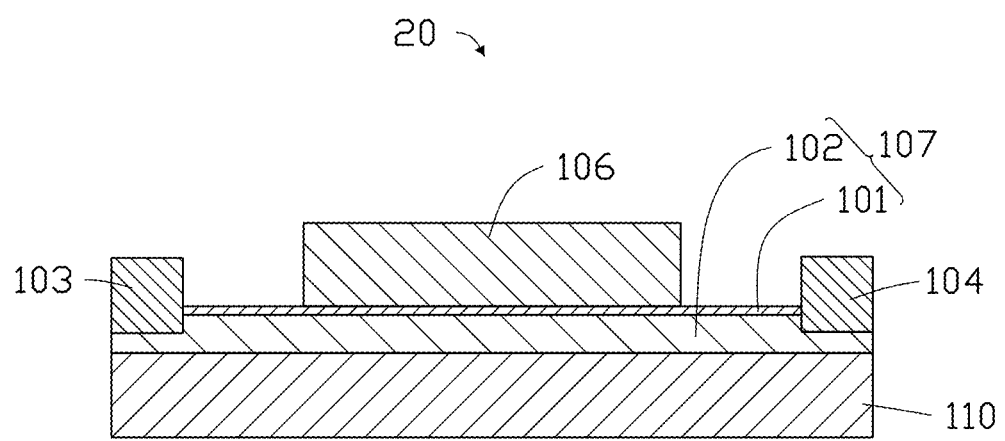
FIG. 9 shows a cross sectional view of the N-type TFT in the method of FIG. 8.
Figure 10:
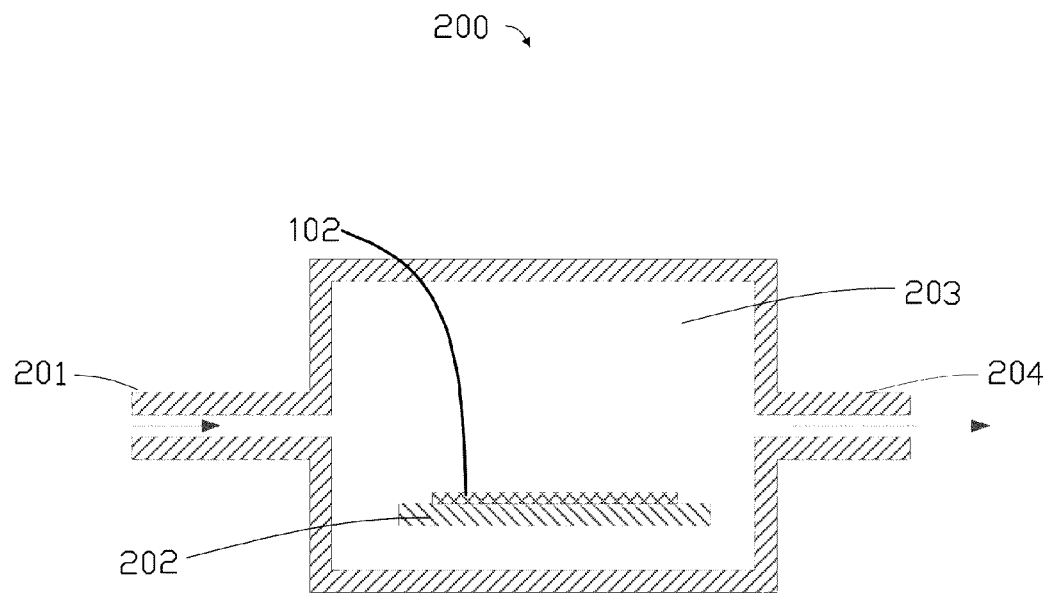
FIG. 10 shows a schematic view of one embodiment of an ALD system.

Referring to FIGS. 8-9, one embodiment of a method of making N-type TFT 20 comprises:

step (S31), forming an N-type semiconductor layer 107 on a surface of the insulating substrate 110, wherein the N-type semiconductor layer 107 comprises a semiconductor carbon nanotube layer 102 and a hafnium oxide layer 101 stacked on the insulating substrate 110;

step (S32), applying a source electrode 103 and a drain electrode 104 on the N-type semiconductor layer 107, wherein the source electrode 103 and the drain electrode 104 are spaced from each other and electrically connected to the semiconductor carbon nanotube layer 102;

step (S33), forming a gate electrode 106 on the N-type semiconductor layer 107, wherein the gate electrode 106 is insulated from the semiconductor carbon nanotube layer 102.

The method of making TFT 20 is similar to the method of making TFT 10, except that the TFT 20 is a top-gate electrode type TFT. The gate electrode 106 is formed on the N-type semiconductor layer 107. The hafnium oxide layer 101 is configured to isolate the oxygen in the air and insulate the gate electrode 106 from the semiconductor carbon nanotube layer 102, the source electrode 103, and the drain electrode 104. Thus the insulating layer can be avoided.

In the TFT 20, the gate electrode 106 is located on the N-type semiconductor layer 107 away from the insulating substrate 110. Furthermore, the gate electrode 106 is spaced from the semiconductor carbon nanotube layer 102, the source electrode 103, and the drain electrode 104 via the hafnium oxide layer 101.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A method of making N-type semiconductor layer, the method comprising:
    providing a P-type semiconductor carbon nanotube layer;
    depositing a hafnium oxide layer on the P-type semiconductor carbon nanotube layer via atomic layer deposition, wherein the atomic layer deposition comprises:
        locating the P-type semiconductor carbon nanotube layer into an atomic layer deposition system;
        heating the P-type semiconductor carbon nanotube layer to a temperature ranging from 140° C. to 150° C.;
        introducing a protective gas into the atomic layer deposition system;
        forming the hafnium oxide layer on the P-type semiconductor carbon nanotube layer via introducing hafnium source and water vapor one by one into the atomic layer deposition system in a pulse manner, wherein the hafnium source and the water vapor are carried by a carrier gas, a first pulse time of the hafnium source ranges from 0.02 seconds to 0.03 seconds, and a second pulse time of the water vapor ranges from 0.010 seconds to 0.015 seconds; the P-type semiconductor carbon nanotube layer is fully converted into the N-type semiconductor layer during the depositing the hafnium oxide layer on the P-type semiconductor carbon nanotube layer via atomic layer deposition at the temperature ranging from 140° C. to 150° C.

2. The method of claim 1, wherein the atomic layer deposition system comprise a reactor chamber and a work platform located in the reactor chamber, and the P-type semiconductor carbon nanotube layer is located on the work platform.

3. The method of claim 2, wherein a pressure in the reactor chamber ranges from 0.14 Torr to 0.15 Torr.

4. The method of claim 1, wherein the protective gas is nitrogen, argon, or combination thereof.

5. The method of claim 1, wherein the hafnium source is tetrakis (dimethylamino) hafnium or nitrate hafnium.

6. The method of claim 1, wherein the hafnium source is heated to a first temperature ranging from 70° C. to 75° C. before being introduced into the atomic layer deposition system.

7. The method of claim 1, wherein a flow rate of the carrier gas with the hafnium source ranges from 20 sccm to 40 sccm.

8. The method of claim 1, wherein a flow rate of the carrier gas with the water vapor ranges from 3 sccm to 5 sccm.

9. The method of claim 1, wherein the hafnium source is introduced into the atomic layer deposition system for the first pulse time, and then the hafnium stops being introduced into the atomic layer deposition system; after a first interval T1, the water vapor is introduced for the second pulse time, and then the water vapor stops being introduced into the atomic layer deposition system; after a second interval T2, the hafnium source is introduced again, thus one cycle is finished.

10. The method of claim 9, wherein the first interval T1 ranges from 55 seconds to 65 seconds, and the second interval T2 ranges from 55 seconds to 60 seconds.

11. The method of claim 9, wherein a growth rate of the hafnium oxide layer ranges from 1.04 Å/cycle to 1.08 Å/cycle.

12. The method of claim 1, wherein a thickness of the hafnium oxide ranges from 5 nanometers to 40 nanometers.

13. The method of claim 1, wherein the P-type semiconductor carbon nanotube layer comprises a plurality of single-walled carbon nanotubes entangled with each other.

14. The method of claim 13, wherein the hafnium oxide layer is deposited on an outer surface of each of the plurality of single-walled carbon nanotubes.

15. A method of making N-type thin film transistor, the method comprising:
    forming a gate electrode on an insulating substrate;
    locating an insulating layer to cover the gate electrode;
    depositing an N-type semiconductor layer on the insulating layer, wherein the N-type semiconductor layer is formed by:
        providing a P-type semiconductor carbon nanotube layer;
        depositing a hafnium oxide layer on the P-type semiconductor carbon nanotube layer via atomic layer deposition, wherein the hafnium oxide layer is deposited by:
            locating the P-type semiconductor carbon nanotube layer into an atomic layer deposition system;
            heating the P-type semiconductor carbon nanotube layer to a temperature ranging from 140° C. to 150° C.;
            introducing a protective gas into the atomic layer deposition system; and
            forming the hafnium oxide layer on the P-type semiconductor carbon nanotube layer via introducing hafnium source and water vapor one by one into the atomic layer deposition system in a pulse manner, wherein the hafnium source and the water vapor are carried by a carrier gas, a first pulse time of the hafnium source ranges from 0.02 seconds to 0.03 seconds, and a second pulse time of the water vapor ranges from 0.010 seconds to 0.015 second, and the P-type semiconductor carbon nanotube layer is fully converted into the N-type semiconductor layer during the depositing the hafnium oxide layer on the P-type semiconductor carbon nanotube layer via atomic layer deposition at the temperature ranging from 140° C. to 150° C.;
    applying a source electrode and a drain electrode on the N-type semiconductor layer, wherein the source electrode and the drain electrode are spaced from each other and electrically connected to the semiconductor carbon nanotube layer.

16. The method of claim 15, wherein the insulating substrate is a flexible substrate comprising a material selected from the group consisting of polyethylene terephthalate, polyethylene naphthalate, and polyimide.

17. A method of making N-type thin film transistor, the method comprising:
- depositing an N-type semiconductor layer on an insulating substrate, wherein the N-type semiconductor layer is formed by:
  - providing a P-type semiconductor carbon nanotube layer in an atomic layer deposition system;
  - depositing a hafnium oxide layer on the P-type semiconductor carbon nanotube layer via atomic layer depositions via introducing hafnium source and water vapor one by one into the atomic layer deposition system in a pulse manner, wherein the hafnium source and the water vapor are carried by a carrier gas, a first pulse time of the hafnium source ranges from 0.02 seconds to 0.03 seconds, and a second pulse time of the water vapor ranges from 0.010 seconds to 0.015 second, the P-type semiconductor carbon nanotube layer is heated to a temperature ranging from 140° C. to 150° C., and the P-type semiconductor carbon nanotube layer is fully converted into the N-type semiconductor carbon nanotube layer during the depositing the hafnium oxide layer on the P-type semiconductor carbon nanotube layer via atomic layer deposition at the temperature ranging from 140° C. to 150° C.;
- applying a source electrode and a drain electrode on the N-type semiconductor layer, wherein the source electrode and the drain electrode are spaced from each other and electrically connected to the N-type semiconductor carbon nanotube layer; and
- forming a gate electrode on the N-type semiconductor layer, wherein the gate electrode is insulated from the N-type semiconductor carbon nanotube layer.

18. The method of claim 17, wherein the N-type semiconductor carbon nanotube layer is sandwiched between the hafnium oxide layer and the insulating substrate.

* * * * *